(12) United States Patent
McConnelee et al.

(10) Patent No.: US 9,299,647 B2
(45) Date of Patent: Mar. 29, 2016

(54) ELECTRICAL INTERCONNECT FOR AN INTEGRATED CIRCUIT PACKAGE AND METHOD OF MAKING SAME

(71) Applicant: General Electric Company, Schenectady, NY (US)

(72) Inventors: Paul Alan McConnelee, Albany, NY (US); Kevin Matthew Durocher, Waterford, NY (US); Scott Smith, Niskayuna, NY (US); Donald Paul Cunningham, Dallas, TX (US)

(73) Assignee: General Electric Company, Schenectady, NY (US)

( * ) Notice: Subject to any disclaimer, the term of this patent is extended or adjusted under 35 U.S.C. 154(b) by 98 days.

(21) Appl. No.: 14/181,105

(22) Filed: Feb. 14, 2014

(65) Prior Publication Data

US 2014/0159213 A1 Jun. 12, 2014

Related U.S. Application Data

(63) Continuation of application No. 12/826,359, filed on Jun. 29, 2010, now Pat. No. 8,653,670.

(51) Int. Cl.
*H01L 23/48* (2006.01)
*H01L 23/498* (2006.01)
(Continued)

(52) U.S. Cl.
CPC ...... *H01L 23/49805* (2013.01); *H01L 23/5389* (2013.01); *H01L 24/19* (2013.01); *H01L 24/82* (2013.01); *H01L 23/49827* (2013.01); *H01L 23/49833* (2013.01); *H01L 2224/92144* (2013.01); *H01L 2924/01029* (2013.01); *H01L 2924/12042* (2013.01)

(58) Field of Classification Search
CPC . H01L 43/02; H01L 51/5246; H01L 51/0067; H01L 43/08; H01L 51/0072
USPC .................. 257/773, 774, E21.576, E23.026, 257/E23.06
See application file for complete search history.

(56) References Cited

U.S. PATENT DOCUMENTS

| 6,495,914 B1 | 12/2002 | Sekine et al. |
| 2004/0089957 A1 | 5/2004 | Shizuno |

(Continued)

FOREIGN PATENT DOCUMENTS

CN 1808711 A 7/2006

OTHER PUBLICATIONS

Unofficial Chinese Search Report issued in connection with corresponding CN Application No. 201110192482.1 dated Nov. 6, 2014.

(Continued)

*Primary Examiner* — Andy Huynh
(74) *Attorney, Agent, or Firm* — Ziolkowski Patent Solutions Group, SC; Jean K. Testa

(57) ABSTRACT

An interconnect assembly for an embedded chip package includes a dielectric layer, first metal layer comprising upper contact pads, second metal layer comprising lower contact pads, and metalized connections formed through the dielectric layer and in contact with the upper and lower contact pads to form electrical connections therebetween. A first surface of the upper contact pads is affixed to a top surface of the dielectric layer and a first surface of the lower contact pads is affixed to a bottom surface of the dielectric layer. An input/output (I/O) of a first side of the interconnect assembly is formed on a surface of the lower contact pads that is opposite the first surface of the lower contact pads, and an I/O of a second side of the interconnect assembly is formed on a surface of the upper contact pads that is opposite the first surface of the upper contact pads.

30 Claims, 7 Drawing Sheets

(51) Int. Cl.
*H01L 23/538* (2006.01)
*H01L 23/00* (2006.01)

(56) References Cited

U.S. PATENT DOCUMENTS

2006/0091524 A1 5/2006 Karashima et al.
2006/0231939 A1 10/2006 Kawabata et al.
2009/0012768 A1 1/2009 Son et al.
2009/0051038 A1 2/2009 Jobetto
2010/0078797 A1 4/2010 McConnelee et al.
2010/0108371 A1 5/2010 Furutani et al.
2010/0132994 A1 6/2010 Fillion et al.
2010/0133705 A1 6/2010 Fillion et al.

OTHER PUBLICATIONS

Search Report and Written Opinion from EP Application No. 11171566.0, dated Apr. 8, 2013.

ELECTRICAL INTERCONNECT FOR AN INTEGRATED CIRCUIT PACKAGE AND METHOD OF MAKING SAME

CROSS-REFERENCE TO RELATED APPLICATION

The present application is a continuation of, and claims priority to, U.S. patent application Ser. No. 12/826,359, filed Jun. 29, 2010, the disclosure of which is incorporated herein by reference.

BACKGROUND OF THE INVENTION

Embodiments of the invention relate generally to integrated circuit packages and, more particularly, to an apparatus and method of fabricating a pre-fabricated electrical interconnect for an integrated circuit package.

As integrated circuits become increasingly smaller and yield better operating performance, packaging technology for integrated circuit (IC) packaging has correspondingly evolved from leaded packaging to laminated-based ball grid array (BGA) packaging and eventually to chip scale packaging (CSP). Advancements in IC chip packaging technology are driven by ever-increasing needs for achieving better performance, greater miniaturization, and higher reliability. New packaging technology has to further provide for the possibilities of batch production for the purpose of large-scale manufacturing thereby allowing economy of scale.

A standard CSP manufacturing process typically begins with placement of one or more dies onto a top surface of a silicon IC substrate. A plurality of re-distribution layers are then deposited onto the IC substrate and the die(s) and are patterned to form a thin-film metal re-routing and interconnection system. The re-distribution layers are typically formed from a benzocyclobutene (BCB) or polyimide material, for example, and applied via a spin-on or lamination application process. The electrical connection between the laminate re-distribution layers and the die(s) form an input/output (I/O) system to and from the die(s).

Advancements in IC packaging requirements pose challenges to the existing embedded chip build-up process. That is, it is desired in many current embedded chip packages to have an I/O system that provides inputs and outputs to both sides of the final IC package. In order to achieve this doubled-sided I/O system, electrical interconnections to the die(s) must be routed around the die(s) to the top and bottom surfaces of the IC package.

Several different methods have been developed to form a double-sided I/O system. For example, multiple lamination or re-distribution layers may be applied to the IC substrate to achieve the desired I/O system. However, the process of applying re-distribution layers in a layer-by-layer fashion can lead to warpage in the rerouting and interconnection system, requiring the use of a molded epoxy stress balance layer or metal stiffener to maintain a flat or planer IC package.

Furthermore, due to the small size and complexity of IC packages, the process for fabricating IC packages is typically expensive and time consuming. Using additional re-distribution layers to create the desired double-sided I/O system increases the number of processing steps, further increasing the cost and complexity of the manufacturing process.

Accordingly, there is a need for a simplified method for fabricating a double-sided I/O system for IC packages. There is a further need for a method for integrating double-sided I/O systems in IC packages while maintaining the flatness of the IC package.

It would therefore be desirable to have an apparatus and method of fabricating a pre-fabricated electrical interconnect for an integrated circuit package.

BRIEF DESCRIPTION OF THE INVENTION

In accordance with one aspect of the invention, an interconnect assembly for an embedded chip package includes a dielectric layer, a first metal layer comprising a plurality of upper contact pads, and a second metal layer comprising a plurality of lower contact pads. A first surface of the plurality of upper contact pads is affixed to a top surface of the dielectric layer and a first surface of the plurality of lower contact pads is affixed to a bottom surface of the dielectric layer. The embedded chip package also includes a plurality of metalized connections formed through the dielectric layer and in contact with the plurality of upper contact pads and the plurality of lower contact pads to form electrical connections therebetween. At least one input/output (I/O) of a first side of the interconnect assembly is formed on a second surface of the plurality of lower contact pads, opposite the first surface of the plurality of lower contact pads, and at least one I/O of a second side of the interconnect assembly is formed on a second surface of the plurality of upper contact pads, opposite the first surface of the plurality of upper contact pads.

In accordance with another aspect of the invention, a method for fabricating an embedded chip package is set forth. The method includes the steps of providing a metalized mounting substrate, coupling a die to a first surface of the mounting substrate, and coupling a first side of a pre-fabricated interconnect structure to the first surface of the mounting substrate. The pre-fabricated interconnect structure includes an insulating substrate having a plurality of metalized contact pads formed on top and bottom surfaces thereof, wherein the metalized contact pads on the top surface of the substrate are electrically connected to the metalized contact pads on the bottom surface of the substrate via a plurality of metal interconnects. The method also includes the step of forming a plurality of electrical connections between the die and the pre-fabricated interconnect structure, wherein the plurality of electrical connections create at least one input/output (I/O) from the die on a second surface of the mounting substrate, opposite the first surface, and at least one I/O from the die on a second side of the pre-fabricated interconnect structure.

In accordance with another aspect of the invention, an embedded chip package includes a mounting substrate having a re-distribution layer formed on a first surface thereof and a first die mounted on a second surface of the mounting substrate, opposite from the first surface. The embedded chip package also includes a pre-fabricated interconnection assembly comprising upper and lower contact layers patterned on a metal-plated insulating substrate. The upper and lower contact layers of the pre-fabricated interconnection assembly are electrically connected via metalized connections therebetween. The upper contact layer of the pre-fabricated interconnection assembly is affixed to the second surface of the mounting substrate and is patterned to be electrically connected to both of the re-distribution layer and the first die.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
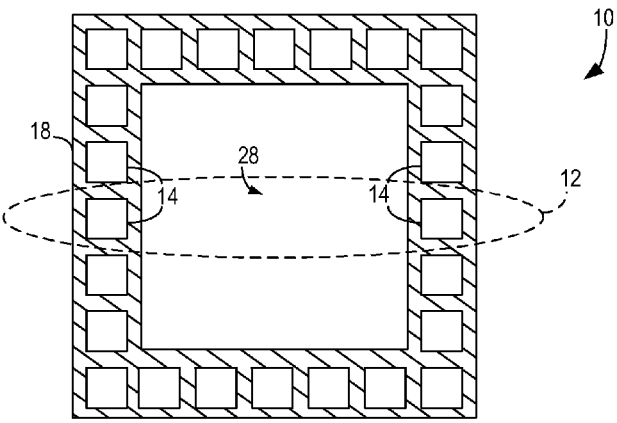
FIG. 1 is a top view of a feed through interconnect according to an embodiment of the invention.
Figure 2:
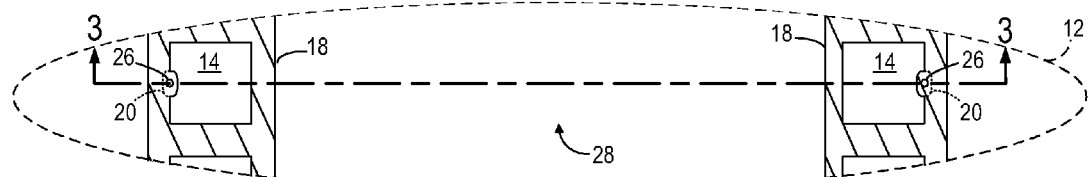
FIG. 2 is an enlarged view of a portion of the feed through interconnect of FIG. 1.
Figure 3:
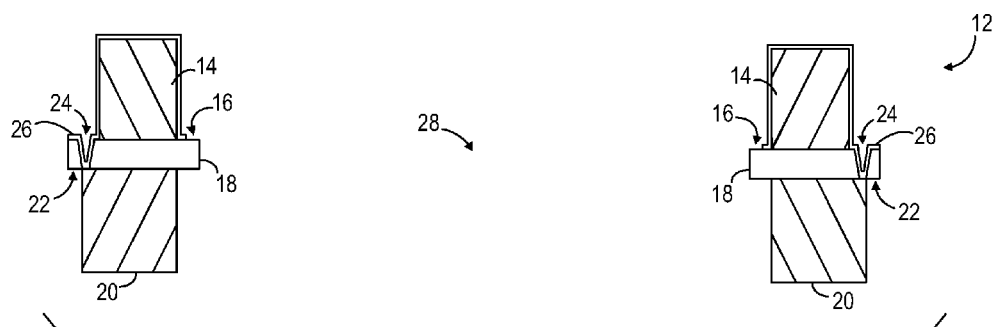
FIG. 3 is a sectional view of the portion of the feed through interconnect illustrated in FIG. 2.

FIG. 1 is a top view of an interconnect assembly or interposer 10 according to an embodiment of the invention. An enlarged view of a portion 12 of interposer 10 is provided in FIG. 2 to illustrate details of interposer 12. FIG. 3 is a sectional view of interposer 12 along line 3-3 of FIG. 2. As shown in FIGS. 1-3, interposer 10 includes a number of copper feed through pads 14 coupled to an upper surface 16 of a dielectric or insulating film layer 18, for example a polyimide material such as Kapton. A number of copper feed through pads 20 are coupled to a lower surface 22 of film 18. As shown in FIGS. 2-3, each upper feed through pad 14 has a corresponding lower feed through pad 20 aligned therewith. One skilled in the art will recognize that the number, shape, and pattern of feed through pads 14, 20 may be varied according to a given design specification.

Vias 24 are formed through film layer 18 and extend between top and bottom surfaces 16, 22 of film 18. Metallization paths 26 are formed on top surface 16 of film 18 and extend through vias 24 such that upper feed through pads 14 are electrically coupled to respective lower feed through pads 20. In one embodiment, metallization paths 26 may be formed using a sputtering and plating technique, followed by a lithography process. While FIG. 2 illustrates a single via 24 and corresponding metallization path 26 per pad 14, a second via and metallization path (not shown) may be included in high current applications, for example. Also, an opening 28 may be formed in a center portion of film 18 to accommodate one or more dies (not shown) when interposer 10 is integrated into an IC package, as described in more detail with respect to FIGS. 5-12, below.

Figure 4:
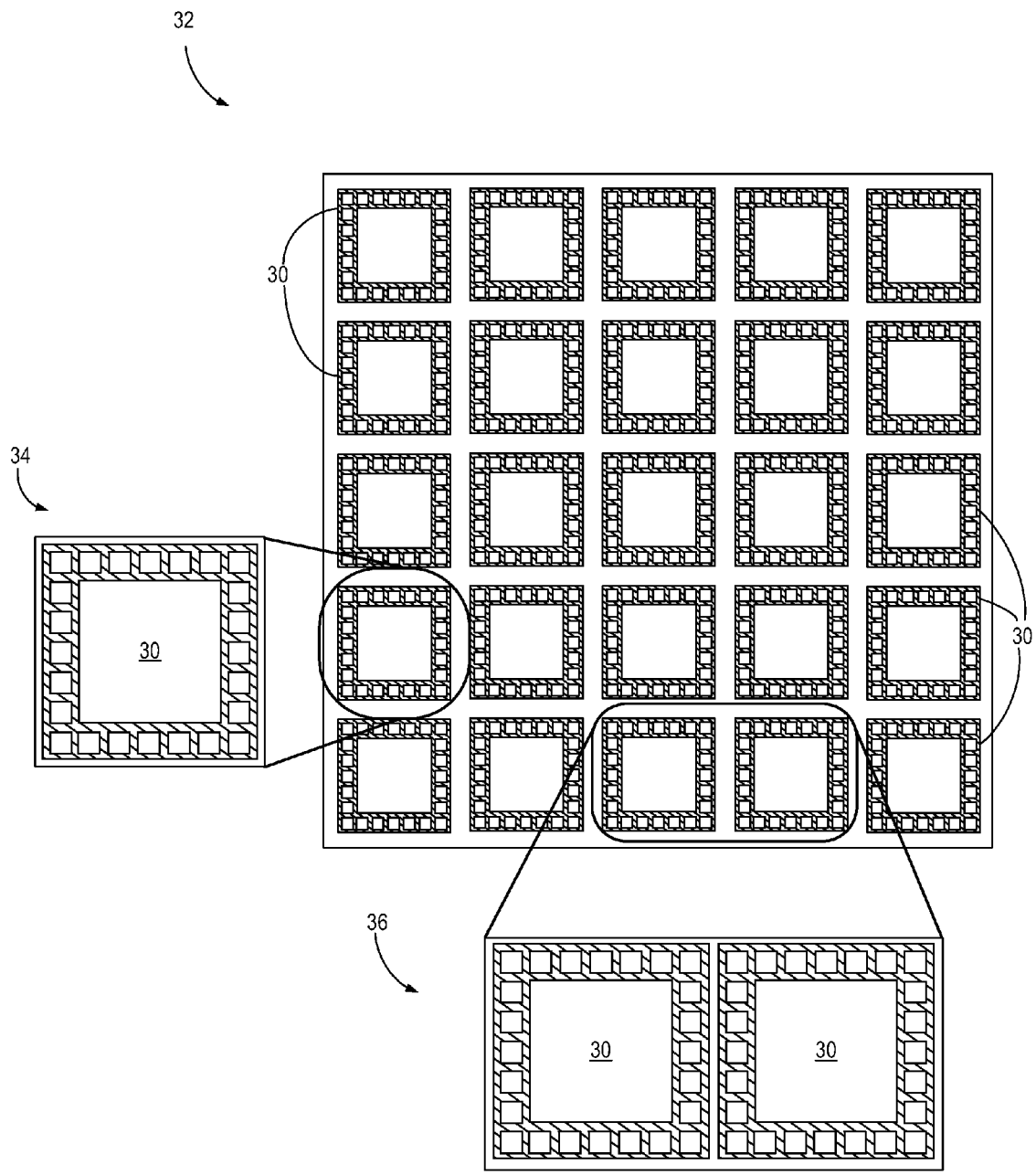
FIG. 4 is a top view of a panel of feed through interconnects according to an embodiment of the invention.

Referring now to FIG. 4, a plurality of feed through interconnects 30, similar to interconnect 10 of FIGS. 1-3 may be fabricated as a panel of interposers 32, according to one embodiment, to increase production speed and reduce manufacturing costs. After panel 32 is processed, individual interconnect modules 34 and/or multiple interconnect modules 36 are laser singulated from panel 32. Modules 34, 36 may be placed on a flex circuit with an embedded die, as described with respect to FIGS. 13-17.

Figure 5:
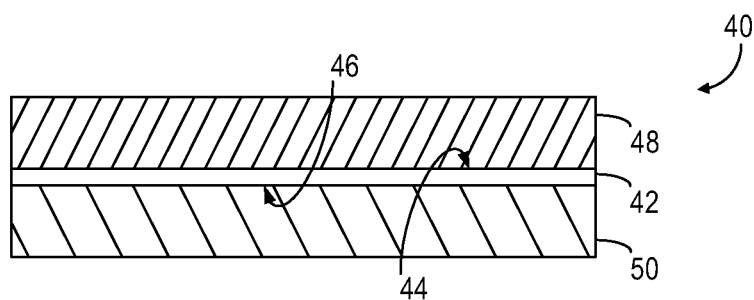
FIGS. 5-12 are schematic diagrams showing steps of making a feed through interconnect in accordance with an embodiment of the invention.
Figure 6:
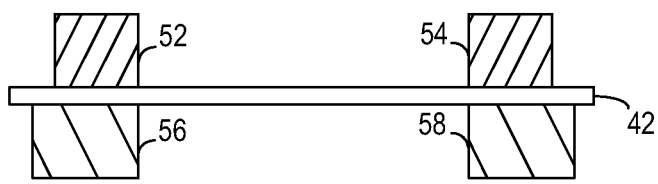

Referring to FIGS. 5-12, a technique for fabricating an interposer or interconnect assembly 38 is set forth, according to an embodiment of the invention. Fabrication of interconnect 38 begins with a sheet of pre-metalized flex 40 that comprises an insulating film material 42, for example a polyimide film such as Kapton. As shown in FIG. 5, top and bottom surfaces 44, 46 of film 42 are plated with respective layers 48, 50 of roll-annealed copper. The thickness of copper layers 48, 50 may be selected depending on design requirements, such as, for example, die thickness. Copper layers 48, 50 are patterned and etched to define a number of upper feed through pads 52, 54 on top surface 44 and lower feed through pads 56, 58 on bottom surface 46, as shown in FIG. 6. The pattern of feed through pads 52-58 may be laid out for a single module or multiple modules, as illustrated in FIG. 4.

According to one embodiment, film 42 is approximately 55 microns thick, and copper layers 48, 50 are each approximately 110 microns thick. However, the dimensions of flex layer 40 may be different based on design specifications. For example, as described in more detail below, the thickness of copper layers 48, 50 may be selected to be approximately equal to or greater than the thickness of a corresponding die. Further, the length and width of the sheet of pre-metalized flex 40 may be selected based on a given processing method and available processing tools.

Figure 7:
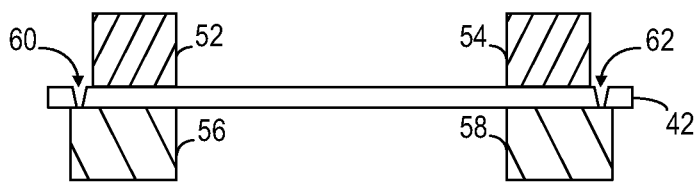
Figure 8:
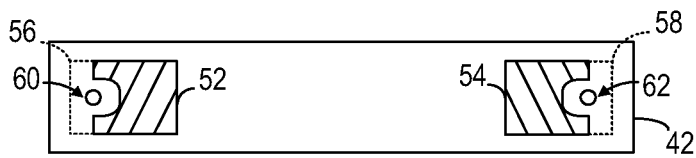
Figure 9:
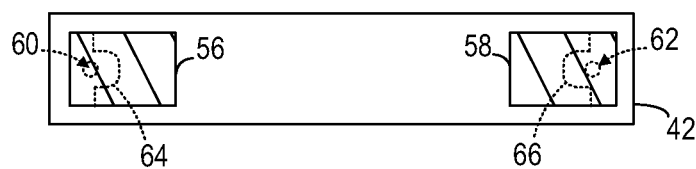

Referring to FIG. 7, vias 60, 62 are formed adjacent to recessed portions 64, 66, and extend through film layer 42. Vias 60, 62 may be formed by UV laser drilling or etching. According to various embodiments, one or more vias 60, 62 may be formed between each pair of lower and upper pads 52-58. FIGS. 8 and 9 illustrate respective top and bottom views of a portion of interconnect 38 after vias 60, 62 have been formed. As shown, upper feed through pads 52, 54 are formed having a recessed portion 64, 66 and lower feed through pads 56, 58 are sized to encompass vias 60, 62. According to one embodiment, lower feed through pads 56, 58 are wider than upper feed through pads 52, 54, as shown in FIGS. 8 and 9. However, one skilled in the art will recognize that the geometry of feed through pads 52-58 can be selected based on via placement and design specifications.

Figure 10:
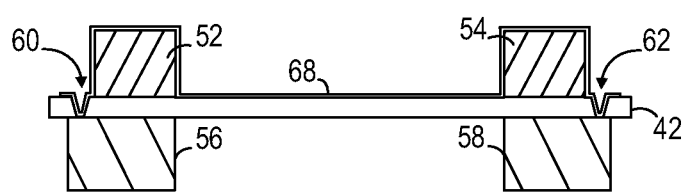
Figure 11:
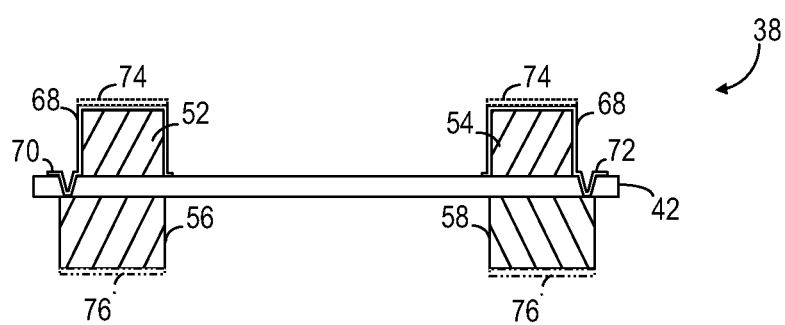

Referring now to FIG. 10, after vias 60, 62 are drilled and cleaned, a metallization layer 68 is applied to top surface 44 of film layer 42 such that it extends through vias 60, 62. Adhesion layer 68 may comprise an initial metallized seed layer of copper and titanium or chrome, for example, a layer of plated copper electroplated atop the seed layer, and a top layer of metal, such as titanium or chrome, for example, sputtered over the plated copper layer to act as an adhesion layer later in the fabrication process. Metallization layer 68 is then patterned and etched, as shown in FIG. 11. The resulting metalized vias 70, 72 form electrical connections between lower and upper pads 52-58. According to one embodiment, an optional additional metal 74 (shown in phantom), such as titanium or chrome, for example, may be formed atop metallization layer 68 to create an adhesion layer for later use during the assembly process.

Figure 12:
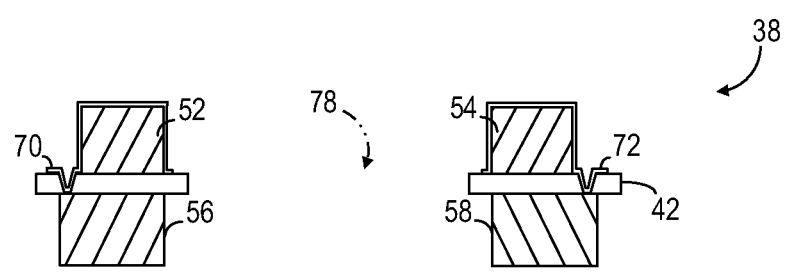

Optionally, an additional layer of metal 76 (shown in phantom), such as, for example, a nickel gold layer, may be applied to lower feed through pads 56, 58 using an electroless or electroplating technique based on design requirements. Referring to FIG. 12, depending on die thickness and design requirements, a portion of film layer 42 may optionally be removed with a laser to create an opening 78 therein that leaves clearance for die placement.

Referring now to FIGS. 13-17, a technique is set forth for fabricating an IC package 80 (FIG. 17) according to an embodiment of the invention. IC package 80 incorporates a feed through interconnect 82, such as interconnect 10 of FIG. 1 or interconnect 38 fabricated as described with respect to FIGS. 5-12 prior to assembly into IC package 80. Interconnect 82 comprises a number of upper feed through pads 84, 86 and lower feed through pads 88, 90 positioned on an insulating film layer 92. Metalized vias 94, 96 create an electrical connection between upper and lower feed through pads 84-90.

Figure 13:
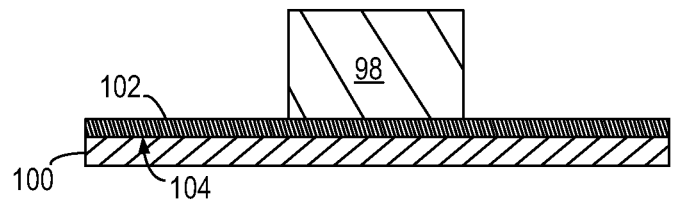
FIGS. 13-17 are schematic diagrams showing steps of making an IC package incorporating a feed through interconnect in accordance with an embodiment of the invention.
Figure 14:
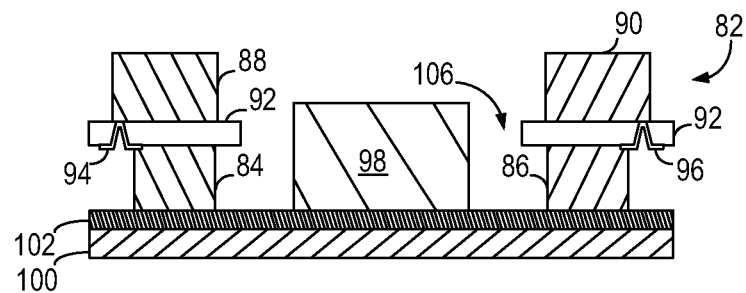

As shown in FIG. 13, fabrication of IC package 80 begins with positioning a die or semiconductor chip 98 on an insulating sheet 100, which may be stretched on a frame (not shown) during the fabrication process to control distortion. According to one embodiment, sheet 100 comprises a pre-patterned dielectric flex material such as, for example, Kapton film having a thickness of approximately 1-2 mil. A layer of epoxy adhesive 102 is applied to coat a top surface 104 of sheet 100. Epoxy adhesive 102 is then B-staged using a low temperature bake, which leaves epoxy adhesive 102 in a tacky state. Next, die 98 is positioned facedown into epoxy adhesive 102 using a pick and place system. After positioning die 98, interconnect 82 is placed into epoxy adhesive 102 and aligned around die 98 and the metallization pattern of flex layer 100. As shown in FIG. 14, interconnect 82 is aligned with die 98 such that die 98 extends through an opening 106 in film layer 92. Once die 98 and interconnect 82 are positioned, epoxy adhesive 102 is fully cured.

Figure 15:
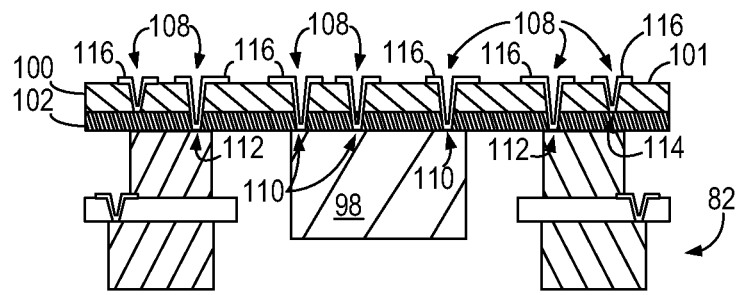
Figure 16:
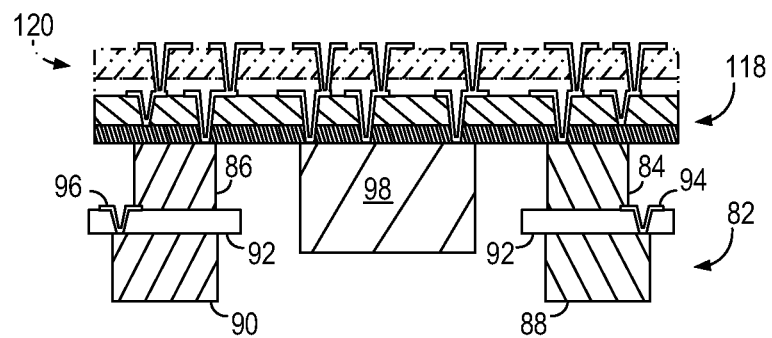

Referring now to FIG. 15, the fabrication technique continues with an embedded chip build up process. A plurality of vias 108 are formed through flex layer 100 to a number of contact surfaces 110 on die 98, a number of contact surfaces 112 on interconnect 82, and a number of contact surfaces 114 within flex layer 100. Vias 108 may be formed by UV laser drilling or dry etching, for example. After vias 108 are cleaned, metallization paths 116 are formed on top surface 101 of film 100. Metallization paths 116 extend through respective vias 108 and are electrically coupled to die 98 and upper feed through pads 84, 86 at respective contact surfaces 110, 112. In one embodiment, metallization paths 116 may comprise a layer of copper and may be formed using a sputtering and plating technique, followed by a lithography process. Together, flex layer 100, vias 108, and metallization paths 116 form a first redistribution layer 118. Optionally, an additional redistribution layer 120 may be laminated atop first redistribution layer 118. Although FIG. 16 illustrates two redistribution layers 118, 120, one skilled in the art will readily recognize the number and configuration of redistribution layers may be selected based on design specifications.

Figure 17:
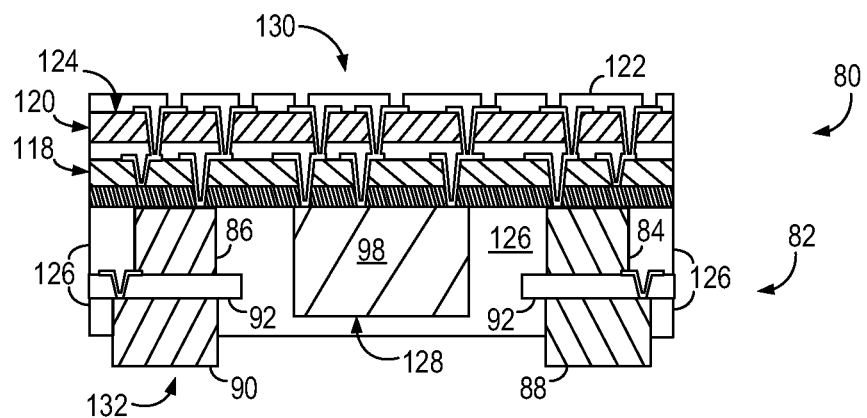

As shown in FIG. 17, the fabrication technique continues with the application of a soldermask layer 122 to coat a top surface 124 of redistribution layers 118, 120. An underfill material 126, such as an epoxy or other filler, for example, is also applied around die 98 and interconnect 82 to provide additional structural strength and isolation between pads 84-90. Alternatively, underfill 126 may be applied such that it does not cover a back surface 128 of die 98. Underfill 126 may be added earlier in the fabrication process after epoxy adhesive 102 has cured, according to alternative embodiments. The resulting IC package 80 has at least one input/output from die 98 on both a top side 130 and a bottom side 132 of IC package 80.

While FIGS. 13-17 are described with respect to a single IC package, one skilled in the art will recognize that the fabrication technique for an IC package is equally applicable to the simultaneous fabrication of a number of IC packages in a panelized form. In such an embodiment, multiple feed through interconnects are positioned around a number of dies on an insulating sheet. To reduce fabrication time, multiple interconnect modules, such as modules 36 (FIG. 4), may be used. Once fabrication is complete, the IC package panel can be laser singulated into individual IC packages.

Figure 18:
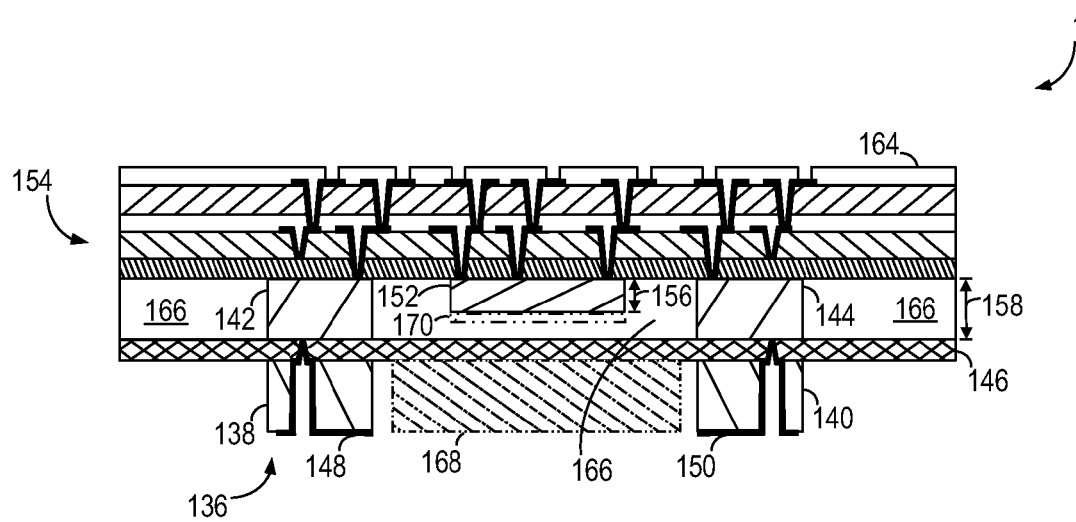
FIG. 18 is a diagram of a pre-fabricated interconnect integrated into an IC package assembly in accordance with an embodiment of the invention.

Referring to FIG. 18, an IC package 134 is shown, according to an alternative embodiment. IC package 134 includes a pre-fabricated interconnect assembly 136 comprising pairs of upper and lower feed through pads 138-144 mounted on a dielectric layer 146. Metalized vias 148, 150, which are formed in an alternative matter than that described with respect to FIGS. 7-11, extend though upper feed through pads 138, 140 and dielectric layer 146, creating an electrical connection with lower feed through pads 142, 144. Because metalized vias 148, 150 extend through upper feed through pads 138, 140, upper and lower feed through pads 138-144 may be formed having similar geometries. IC package 134 also includes a die 152 affixed to one or more first redistribution layers 154. Interconnect 136 is positioned around die 152. Because die 152 has a thickness 156 that is less than a thickness 158 of lower feed through pads 142, 144, dielectric layer 146 may be left intact, creating a buried die configuration as shown.

Figure 19:
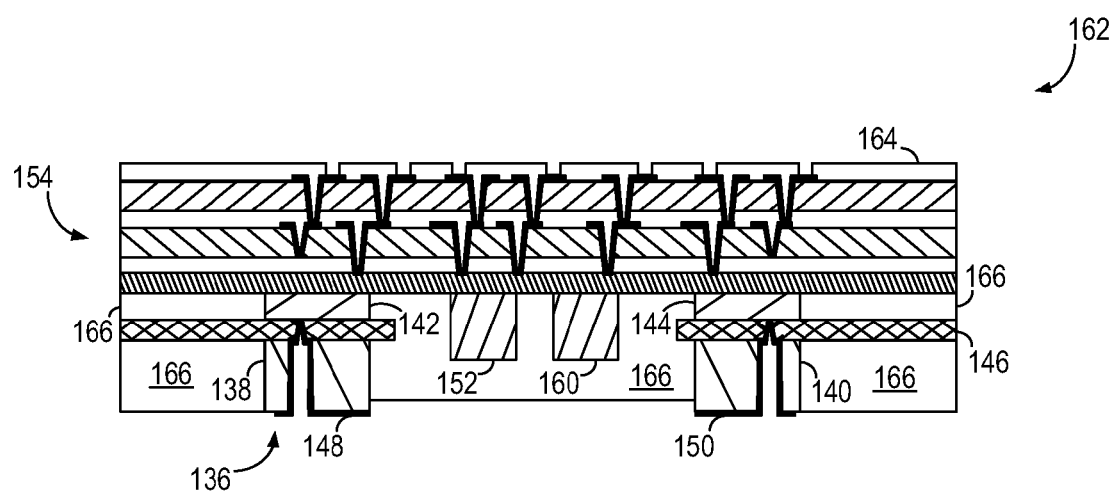
FIG. 19 is a diagram of a pre-fabricated interconnect integrated into an IC package assembly in accordance with another embodiment of the invention.

Alternatively, the thickness of interconnect 136 may be adjusted by reducing the thickness of feed through pads 138-144, as shown in FIG. 19. Further, a second die 160 may be mounted adjacent to die 152, according to an alternative embodiment, to form a multi-chip module 162. One skilled in the art will recognize that any number of additional dies may be included in multi-chip module 162.

Referring again to FIG. 18, IC package 134 also includes a soldermask 164, similar to that described with respect to FIG. 17. A layer of underfill 166 is applied around lower feed through pads 142, 144 and die 152. According to one embodiment, a heat sink 168 (shown in phantom) may optionally be affixed to dielectric layer 146. Alternatively, a heat sink 170 (shown in phantom) may be mated to die 152 for heat dissipation.

Accordingly, embodiments of the invention include an interconnect assembly that may be incorporated into an IC package to allow for input/output from a die to be brought out on both the top and bottom sides of the interconnect assembly. Embodiments of the interconnect assembly may be used with very thin die (e.g., 50 μm or less) and achieve similar electrical connections as conventional integrated chip packages with a reduced number of interlayer patterning and metallization steps.

Additionally, embodiments of the interconnect assembly described herein may be pre-fabricated in various thicknesses to accommodate various die dimensions and device structures such as buried die and stacked die configurations. By pre-fabricating the interconnect assembly, the interconnect may be tested prior to being incorporated into an IC package, improving the yield of the final assembled IC package.

Further, an IC package assembled using the above-described method and pre-fabricated interconnect assembly remains flatter after assembly than an IC package fabricated using conventional methods. Due to the interconnect assembly's structural design and pre-fabricated nature, use of the interconnect assembly in an IC package results in less stresses and planar warpage in the assembled IC package. Thus, the die and mounting substrate of an IC package assembled using a pre-fabricated interconnect assembly remains relatively flat (i.e., deviates from being planar by less than approximately 5%) in the plane parallel to the mounting surface of the die.

Therefore, according to one embodiment of the invention, an interconnect assembly for an embedded chip package includes a dielectric layer, a first metal layer comprising a plurality of upper contact pads, and a second metal layer comprising a plurality of lower contact pads. A first surface of the plurality of upper contact pads is affixed to a top surface of the dielectric layer and a first surface of the plurality of lower contact pads is affixed to a bottom surface of the dielectric layer. The embedded chip package also includes a plurality of metalized connections formed through the dielectric layer and in contact with the plurality of upper contact pads and the plurality of lower contact pads to form electrical connections therebetween. At least one input/output (I/O) of a first side of the interconnect assembly is formed on a second surface of the plurality of lower contact pads, opposite the first surface of the plurality of lower contact pads, and at least one I/O of a second side of the interconnect assembly is formed on a second surface of the plurality of upper contact pads, opposite the first surface of the plurality of upper contact pads.

According to another embodiment of the invention, a method for fabricating an embedded chip package is set forth. The method includes the steps of providing a metalized mounting substrate, coupling a die to a first surface of the mounting substrate, and coupling a first side of a pre-fabricated interconnect structure to the first surface of the mounting substrate. The pre-fabricated interconnect structure includes an insulating substrate having a plurality of metalized contact pads formed on top and bottom surfaces thereof, wherein the metalized contact pads on the top surface of the substrate are electrically connected to the metalized contact pads on the bottom surface of the substrate via a plurality of metal interconnects. The method also includes the step of forming a plurality of electrical connections between the die and the pre-fabricated interconnect structure, wherein the plurality of electrical connections create at least one input/output (I/O) from the die on a second surface of the mounting substrate, opposite the first surface, and at least one I/O from the die on a second side of the pre-fabricated interconnect structure.

According to yet another embodiment of the invention, an embedded chip package includes a mounting substrate having a re-distribution layer formed on a first surface thereof and a first die mounted on a second surface of the mounting substrate, opposite from the first surface. The embedded chip package also includes a pre-fabricated interconnection assembly comprising upper and lower contact layers patterned on a metal-plated insulating substrate. The upper and lower contact layers of the pre-fabricated interconnection assembly are electrically connected via metalized connections therebetween. The upper contact layer of the pre-fabricated interconnection assembly is affixed to the second surface of the mounting substrate and is patterned to be electrically connected to both of the re-distribution layer and the first die.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An interconnect assembly for an embedded chip package, the interconnect assembly comprising:
    an insulating substrate;
    a first metal layer comprising a plurality of upper contact pads, wherein a first surface of the plurality of upper contact pads is affixed to a top surface of the insulating substrate;
    a second metal layer comprising a plurality of lower contact pads, wherein a first surface of the plurality of lower contact pads is affixed to a bottom surface of the insulating substrate; and
    a plurality of electrical connections formed through the insulating substrate and in electrical contact with the plurality of upper contact pads and the plurality of lower contact pads, wherein a portion of a bottom surface of the plurality of electrical connections is directly coupled to the top surface of the insulating substrate.

2. The interconnect assembly of claim 1 wherein the insulating substrate comprises a polyimide film.

3. The interconnect assembly of claim 1 wherein the first and second metal layers comprise copper.

4. The interconnect assembly of claim 1 further comprising at least one of a titanium layer and a chrome layer coupled to the second surface of the plurality of upper contact pads.

5. The interconnect assembly of claim 1 wherein the plurality of electrical connections extend from the first surface of the plurality of lower contact pads to the second surface of the plurality of upper contact pads.

6. The interconnect assembly of claim 1 wherein the plurality of electrical connections extend from the first surface of the plurality of lower contact pads to the top surface of the insulating substrate.

7. The interconnect assembly of claim 6 wherein the plurality of electrical connections extend to the top surface of the insulating substrate at a position adjacent to a mounting location of the plurality of upper contact pads.

8. The interconnect assembly of claim 1 wherein a first side of the interconnect assembly is electrically conductive and is electrically connected to a second side of the interconnect assembly.

9. A method for fabricating an embedded chip package comprising:
    providing a mounting substrate;
    coupling a first side of a die to a first surface of the mounting substrate;
    coupling a first side of an interconnect structure to the first surface of the mounting substrate so that the first side of the interconnect structure is substantially coplanar with the first side of the die, the interconnect structure comprising an insulating substrate having a plurality of metalized contact pads formed on top and bottom surfaces thereof, wherein the metalized contact pads on the top surface of the insulating substrate are electrically connected to the metalized contact pads on the bottom surface of the insulating substrate via a plurality of metal interconnects and the metalized contact pads on the top surface of the insulating substrate are substantially coplanar with the first side of the die; and
    forming a plurality of electrical connections between the die and the interconnect structure.

10. The method of claim 9 further comprising:
    creating at least one electrical connection between the die and a second surface of the mounting substrate; and
    creating at least one electrical connection between the die and a second side of the interconnect structure.

11. The method of claim 10 further comprising assembling the interconnect structure prior to coupling the interconnect structure to the mounting substrate.

12. The method of claim 10 further comprising positioning the die within an opening formed in the interconnect structure.

13. The method of claim 9 wherein coupling the first side of the interconnect structure further comprises aligning the first side of the interconnect structure with the die.

14. The method of claim 9 further comprising:
forming an adhesive layer on the first surface of the mounting substrate;
coupling the first side of the die to a first surface of the adhesive layer; and
coupling the first side of the interconnect structure to the first surface of the adhesive layer.

15. The method of claim 11 further comprising forming at least one re-distribution layer on a second surface of the mounting substrate.

16. The method of claim 15 wherein forming the at least one re-distribution layer comprises:
forming a first plurality of vias between an exposed surface of the re-distribution layer and the die;
forming a second plurality of vias between the exposed surface of the re-distribution layer and the interconnect structure; and
metalizing the first and second pluralities of vias.

17. A chip package comprising:
a substrate having at least one re-distribution layer formed on a first surface thereof;
a first die mounted on a second surface of the substrate, opposite from the first surface;
an interconnection assembly comprising upper and lower conductive layers provided on an insulating substrate, the upper and lower conductive layers electrically connected via metalized connections therebetween; and
wherein the upper conductive layer of the interconnection assembly is affixed to the second surface of the substrate and electrically connected to the at least one re-distribution layer.

18. The chip package of claim 17 wherein the upper conductive layer of the interconnection assembly is electrically connected to the first die.

19. The chip package of claim 17 wherein the upper conductive layer comprises a plurality of upper copper pads; and wherein the lower conductive layer comprises a plurality of lower copper pads.

20. The chip package of claim 19 wherein the plurality of upper copper pads is aligned with the plurality of lower copper pads such that each upper copper pad has a lower copper pad aligned thereto.

21. The chip package of claim 17 wherein an upper surface of the upper conductive layer is affixed to the second surface of the substrate; and
wherein a plurality of metalized vias are formed between an upper surface of the lower conductive layer and a lower surface of the upper conductive layer, opposite the upper surface.

22. The chip package of claim 17 wherein the insulating substrate has a die opening formed therein; and
wherein the interconnection assembly is aligned with the first die such that the die extends through the die opening.

23. The chip package of claim 22 wherein the first die has a height that is greater than a combined height of the upper conductive layer and the insulating substrate and less than a combined height of the upper conductive layer, the insulating substrate, and the lower conductive layer.

24. The chip package of claim 17 wherein the first die has a height less than a height of the upper conductive layer.

25. The chip package of claim 17 wherein the at least one re-distribution layer comprises at least one metalized flex layer having a plurality of metalized vias formed therethrough.

26. The chip package of claim 17 further comprising a second die mounted adjacent to the first die on the second surface of the substrate.

27. The chip package of claim 17 wherein the first die is embedded within an isolating material.

28. The chip package of claim 17 wherein the first die is embedded within an opening formed in the interconnection assembly.

29. The chip package of claim 17 wherein the interconnection assembly substantially surrounds the first die.

30. The chip package of claim 17 further comprising a second re-distribution layer electrically connected to the first die.

* * * * *